United States Patent
Matsuta

(10) Patent No.: US 7,477,111 B2
(45) Date of Patent: Jan. 13, 2009

(54) DIGITALLY CONTROLLED OSCILLATOR

(75) Inventor: Hiroto Matsuta, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/359,498

(22) Filed: Feb. 23, 2006

(65) Prior Publication Data

US 2007/0120613 A1    May 31, 2007

(30) Foreign Application Priority Data

Nov. 29, 2005   (JP)   ............... 2005-343641

(51) Int. Cl.
*H03K 3/03* (2006.01)
(52) U.S. Cl. ............ 331/57; 331/177 V; 331/36 C
(58) Field of Classification Search ........... 331/34, 331/36 C, 57, 177 R, 177 V
See application file for complete search history.

(56) References Cited

U.S. PATENT DOCUMENTS

| | | | | |
|---|---|---|---|---|
| 5,617,454 A | * | 4/1997 | Gotz et al. | 375/376 |
| 6,836,193 B1 | * | 12/2004 | Kim et al. | 331/179 |
| 2005/0248415 A1 | * | 11/2005 | Osvaldella | 331/57 |

FOREIGN PATENT DOCUMENTS

JP   5-275931 A   10/1993
JP   8-32412 A   2/1996

* cited by examiner

*Primary Examiner*—Robert Pascal
*Assistant Examiner*—Ryan J. Johnson
(74) *Attorney, Agent, or Firm*—Arent Fox LLP

(57) ABSTRACT

A plurality of variable load capacitance circuits is connected to each node between adjacent delay circuits of a ring oscillator, and changes load capacitance according to an external control signal. The control circuit adjusts timing the control signal is inputted to these variable load capacitance circuits, using a clock signal of one or more nodes of the ring oscillator.

12 Claims, 21 Drawing Sheets

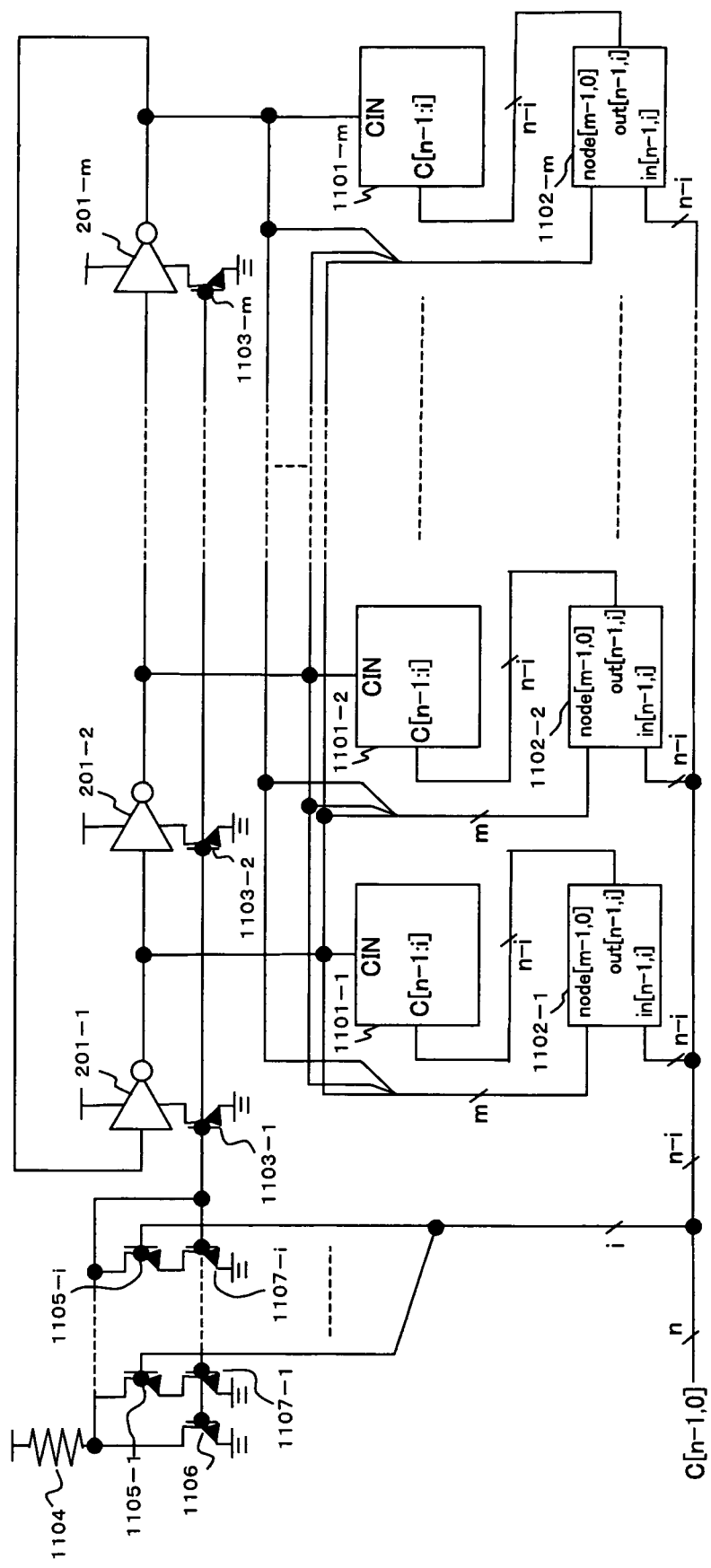
F I G. 11B

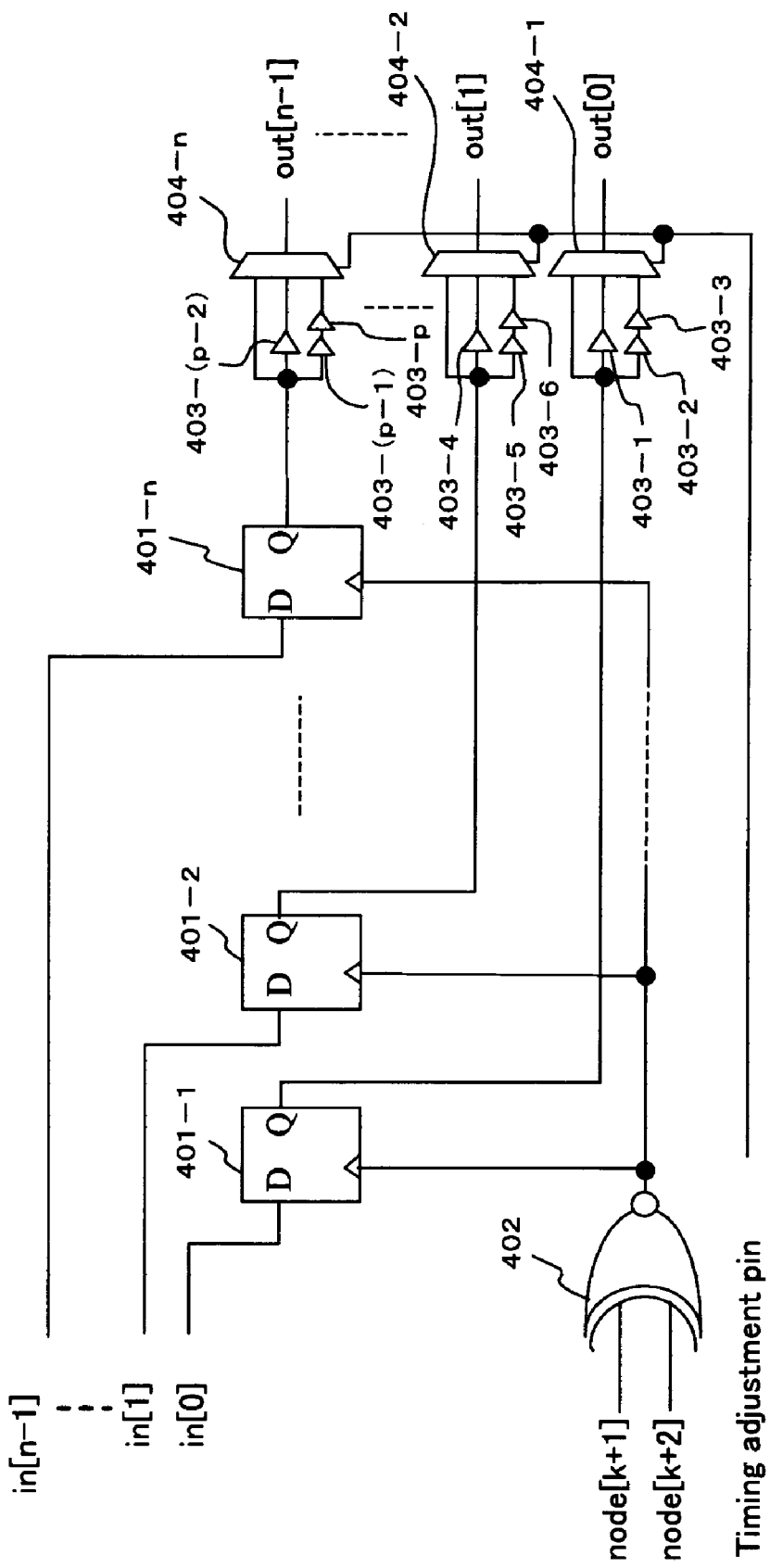
F I G. 12

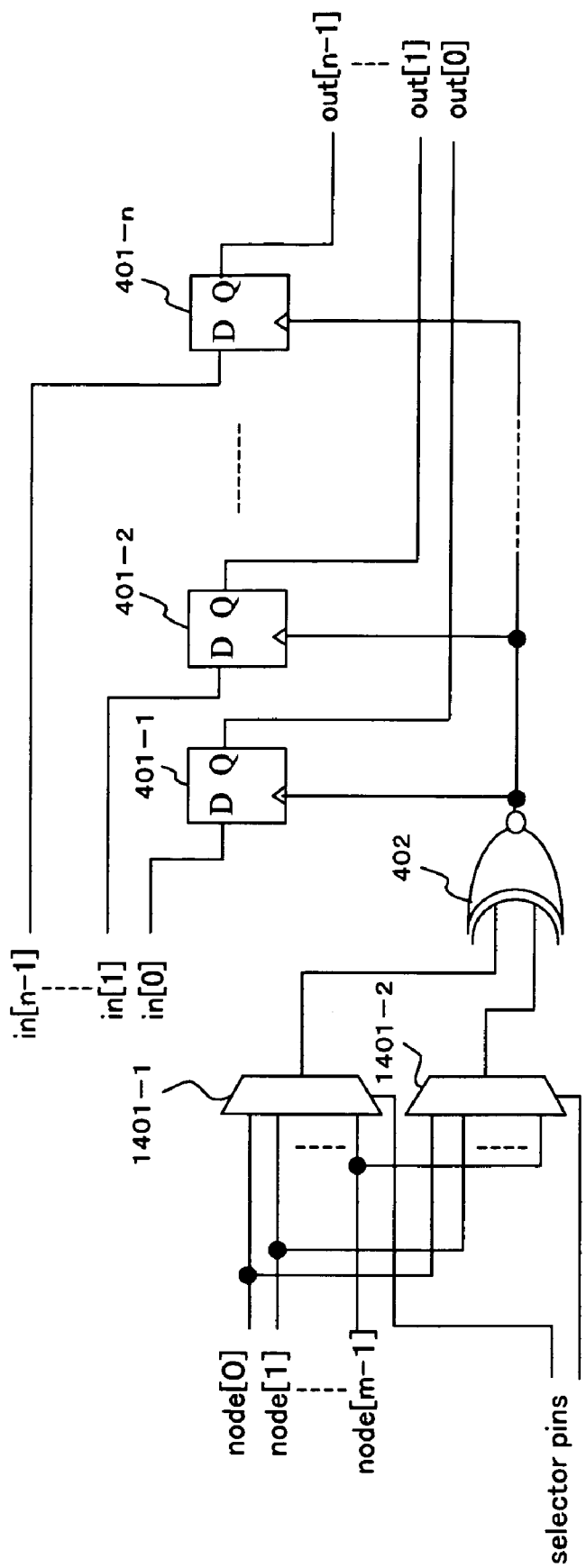
F I G. 14

DIGITALLY CONTROLLED OSCILLATOR

CROSS REFERENCE TO RELATED APPLICATIONS

This application is based upon and claims the benefit of priority from the prior Japanese Patent Application Publication No. 2005-343641, filed Nov. 29, 2005, the entire contents of which are incorporated herein by this reference.

BACKGROUND OF THE INVENTION

1. Field of the Invention

The present invention relates to a digitally controlled oscillator whose oscillation frequency is controlled by a digital signal.

2. Description of the Related Art

Recently, the research and development of a fully digital phase-locked loop (PLL) whose components are all digital has been advanced. In order to realize a fully digital PLL, a digitally controlled oscillator whose oscillation frequency is digitally controlled is needed.

FIG. 1A shows an example of a conventional digitally controlled oscillator (for example, see Patent reference 1). This digitally controlled oscillator comprises a ring oscillator composed of m inverter circuits 11-1~11-m. To respective nodes of the ring oscillator, variable load capacitance circuits 12-h (h=1, 2, . . . , m) are connected, and by changing the load capacitance connected to each node by n bits of control signal C[n−1:0], the frequency of the ring oscillator is changed.

Patent reference 1: Japanese Patent Application Publication No. 08-032412

FIG. 1B shows an example of the configuration of the variable load capacitance circuit 12-h shown in FIG. 1A. This variable load capacitance circuit comprises n N-channel metal-oxide semiconductor (NMOS) transistors 13-1~13-n and n capacitors 14-1~14-n. Each transistor 13-g (g=1, 2, . . . , n) performs a switching operation by a control signal C[g−1]. If C[g−1] is logic "1" (high), the transistor 13-g connects the capacitor 14-g to CIN. If C[g−1] is logic "0" (low), it disconnects the capacitor 14-g from CIN. Thus, the load capacitance connected to each node of the ring oscillator is changed.

The above-described conventional digitally controlled oscillator has the following problems.

When the capacitance-control type digitally controlled oscillator shown in FIG. 1B is actually built and used in a PLL, a control signal C[n−1:0] always changes, based on information about the phase comparison between a feedback clock signal and a reference clock signal of the PLL.

For example, it is assumed that each of capacitors cap2, cap1 and cap0 whose capacitance ratio is 4:2:1 are controlled by a control signal xyz. In this case, if, as shown FIG. 1C, capacitance contribution from cap2 changes earlier than that of cap1 or cap0 changes when the end of xyz is carried from "011" to "100", the entire capacitance instantaneously increases. Conversely, as shown in FIG. 1D, capacitance contribution from cap2 changes later than that of cap1 or cap0 changes, the entire capacitance instantaneously decreases.

When a digital control signal transits in such a way, especially when the on/off of all capacitors is switched where the end of the signal is carried, such a large instantaneous capacitance change gives a timing change (jitter) to the edge of a clock signal generated by a ring oscillator, which is a problem in designing an LSI.

SUMMARY OF THE INVENTION

It is an object of the present invention to reduce the jitter of a clock signal caused when an inputted digital control signal transits in a digitally controlled oscillator.

The digitally controlled oscillator of the present invention comprises a ring oscillator composed of m delay circuits connected in a ring, m variable load capacitance circuits and a control circuit.

Each of the m variable load capacitance circuits is connected to each node between the adjacent delay circuits of the ring oscillator, and changes its load capacitance according to an external control signal. The control circuit adjusts timing the control signal is inputted to the variable load capacitance circuits, using a clock signal of one or more nodes of the ring oscillator.

BRIEF DESCRIPTIONS OF THE DRAWINGS

FIG. 11B shows the sixth configuration of the digitally controlled oscillator.

FIG. 12 shows the fourth configuration of the timing adjustment circuit.

FIG. 14 shows the fifth configuration of the timing adjustment circuit.

DESCRIPTION OF THE PREFERRED EMBODIMENTS

The preferred embodiments of the present invention are described in detail below with reference to the drawings.

Figure 2:
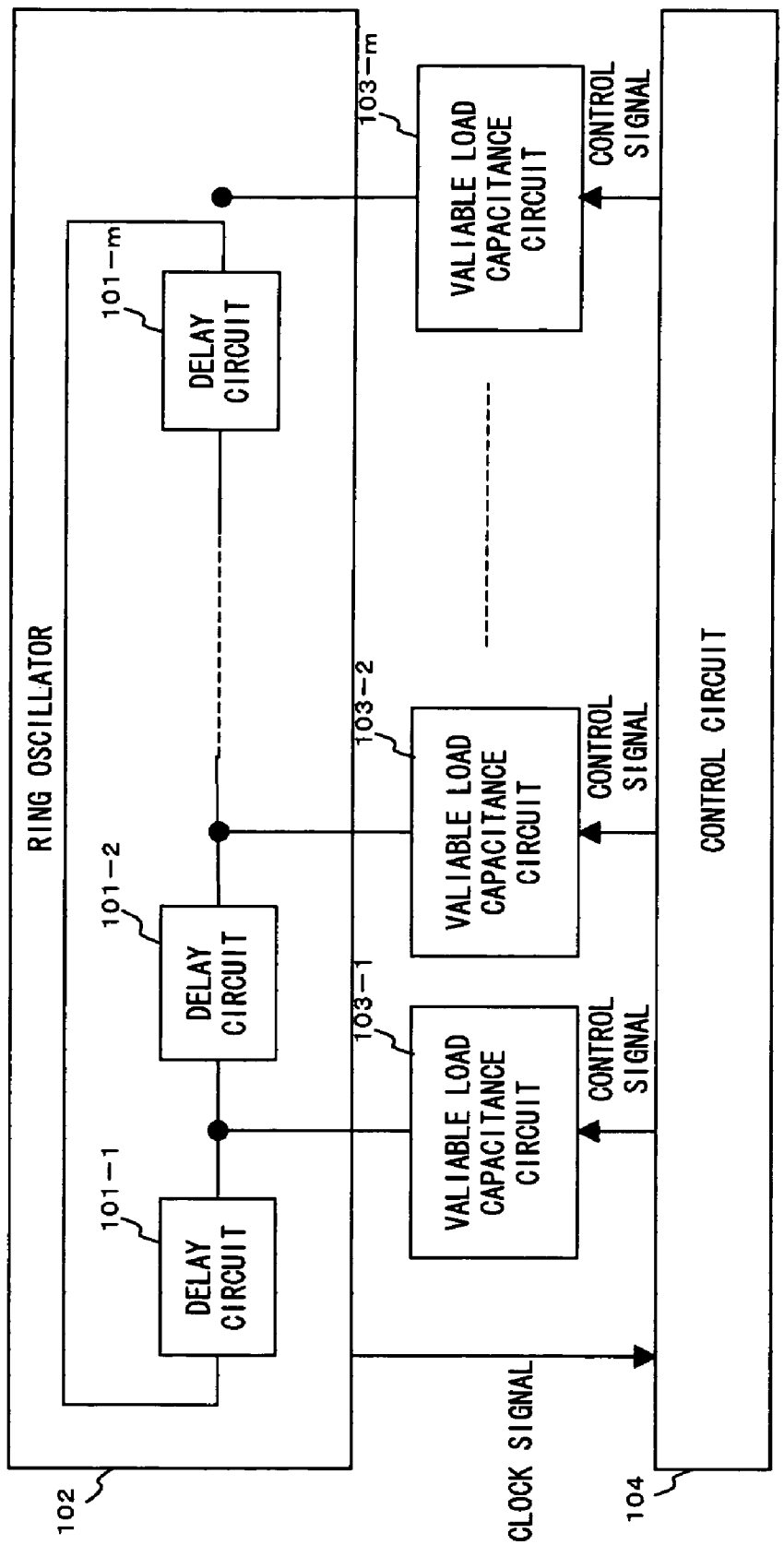
FIG. 2 shows the principle configuration of the digitally controlled oscillator of the present invention.

FIG. 2 shows the basic configuration of the digitally controlled oscillator of the present invention. The digitally controlled oscillator shown in FIG. 2 comprises a ring oscillator composed of m delay circuits 101-1~101-m connected in a ring, m variable load capacitance circuits 103-1~103-m and a control circuit 104.

Each of the variable load capacitance circuits 103-1~103-m is connected to each node between the adjacent delay circuits of the ring oscillator, and changes its load capacitance, according to an external control signal. The control circuit 104 adjusts timing the control signal is inputted to the variable load capacitance circuits 103-1~103-m, using a clock signal of one or more nodes of the ring oscillators 102.

In this case, the control circuit 104, for example, detects the edge of a clock signal from a clock signal in one or more nodes, and when the edge does not pass through a node to which a variable load capacitance circuit 103 to be controlled is connected, the control circuit 104 outputs the control signal to the variable load capacitance circuit 103.

By providing such a control circuit 104, timing the capacitance of each variable load capacitance circuit 103-h (h=1, 2, . . . , m) changes and timing the edge passes through a node to which the variable load capacitance circuit 103-h is connected is prevented from overlapping. Therefore, even if a large capacitance change occurs when a control signal transits, the influence of the change on the edge of the clock signal can be reduced.

The ring oscillator 102 composed of the delay circuits 101-1~101-m, for example, corresponds to a ring oscillator composed of inverter circuits 201-1~201-m, which will be described later, and the variable load capacitance circuits 103-1~103-m, for example, correspond to variable load capacitance circuits 202-1~202-m or variable load capacitance circuits 1101-1~1101-m, which will be described later.

The control circuit 104, for example, corresponds to timing adjustment circuits 203-1~203-m, timing adjustment circuits 301-1~301-m, timing adjustment circuits 1001-1~1001-m or timing adjustment circuits 1102-1~1102-m.

According to the present invention, the jitter of a clock signal due to the large instantaneous change of a load capacitance caused the end of a frequency control signal inputted to a digitally controlled oscillator is carried can be suppressed.

The digitally controlled oscillator of this preferred embodiment can be produced, for example, by a standard digital complementary metal-oxide semiconductor process and is used in a fully digital PLL circuit. This digitally controlled oscillator has a function to detect the edge of a clock signal from one or more nodes of a ring oscillator and to adjust timing a frequency control signal is inputted to a variable load capacitance circuit in such a way that a load capacitance may not change when the edge passes through the node.

Figure 3:
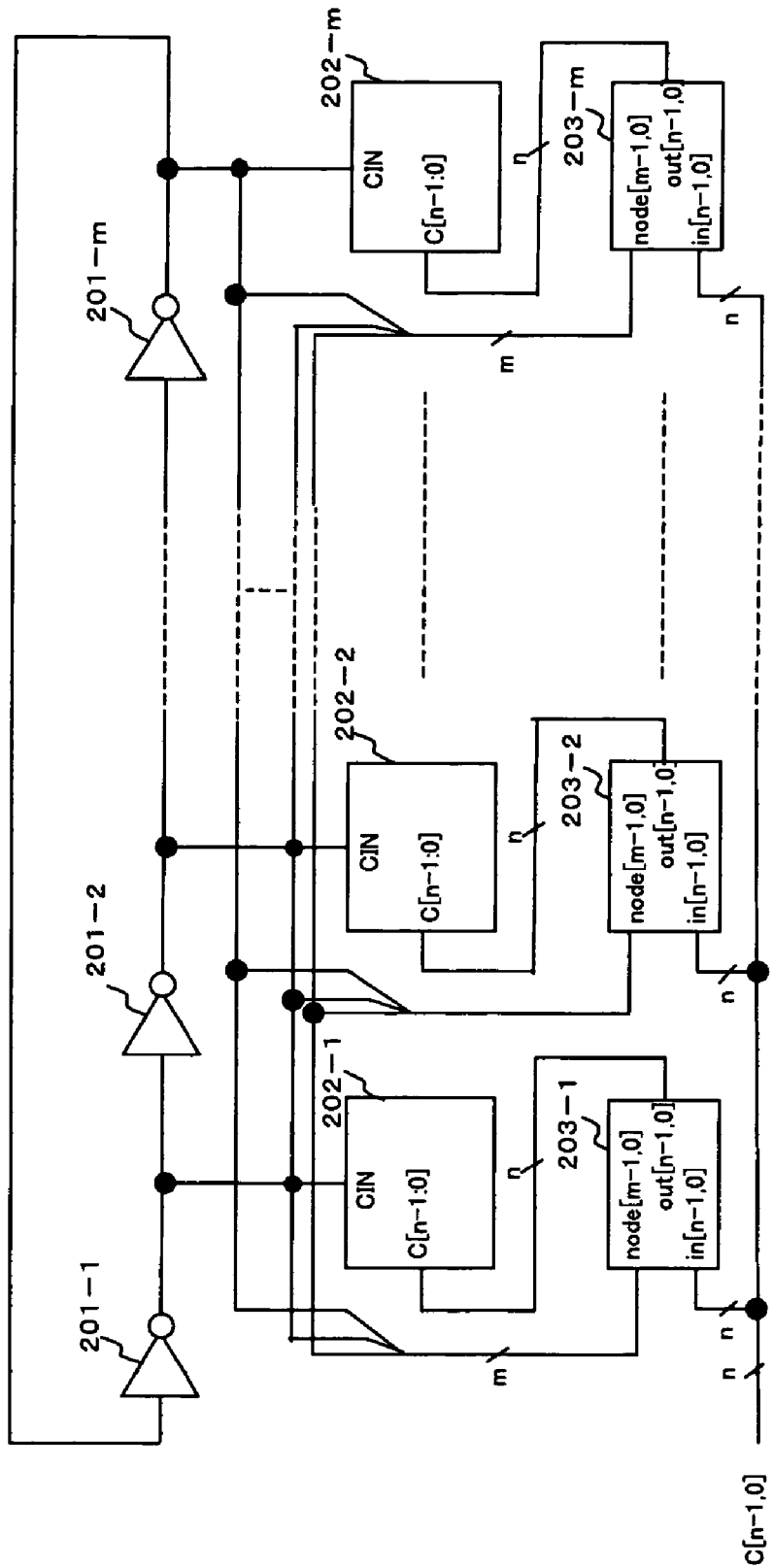
FIG. 3 shows the first configuration of the digitally controlled oscillator.

FIG. 3 shows the first configuration of such a digitally controlled oscillator. This digitally controlled oscillator comprises a ring oscillator composed of m inverter circuit 201-1~201-m, m variable load capacitance circuits 202-1~202-m, m timing adjustment circuits 203-1~203-m.

Figure 1A:
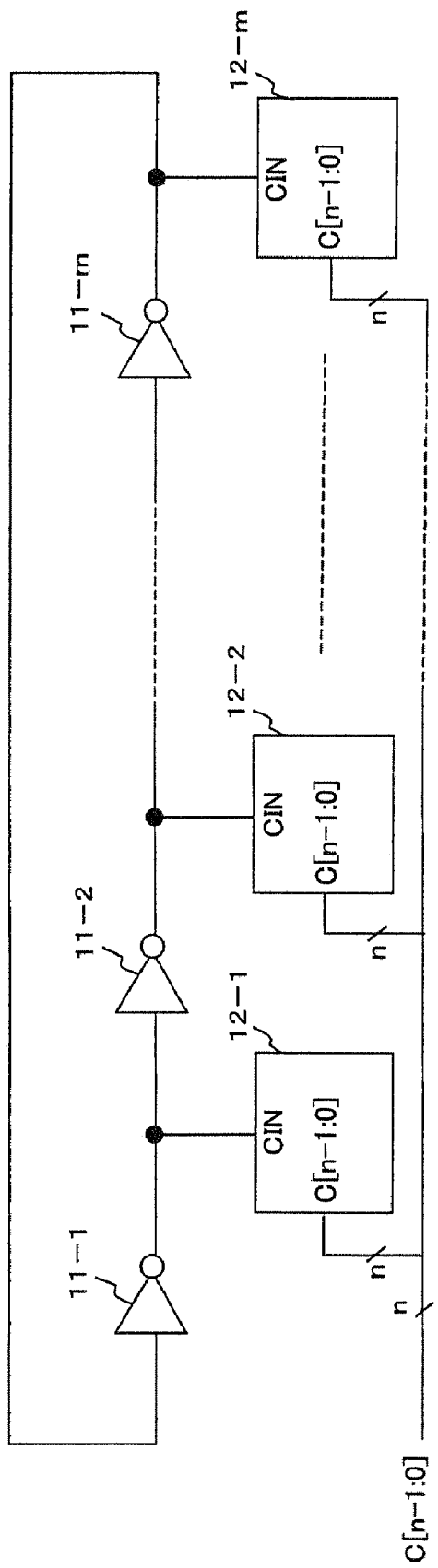
FIG. 1A shows the configuration of a conventional digitally controlled oscillator.
Figure 1B:
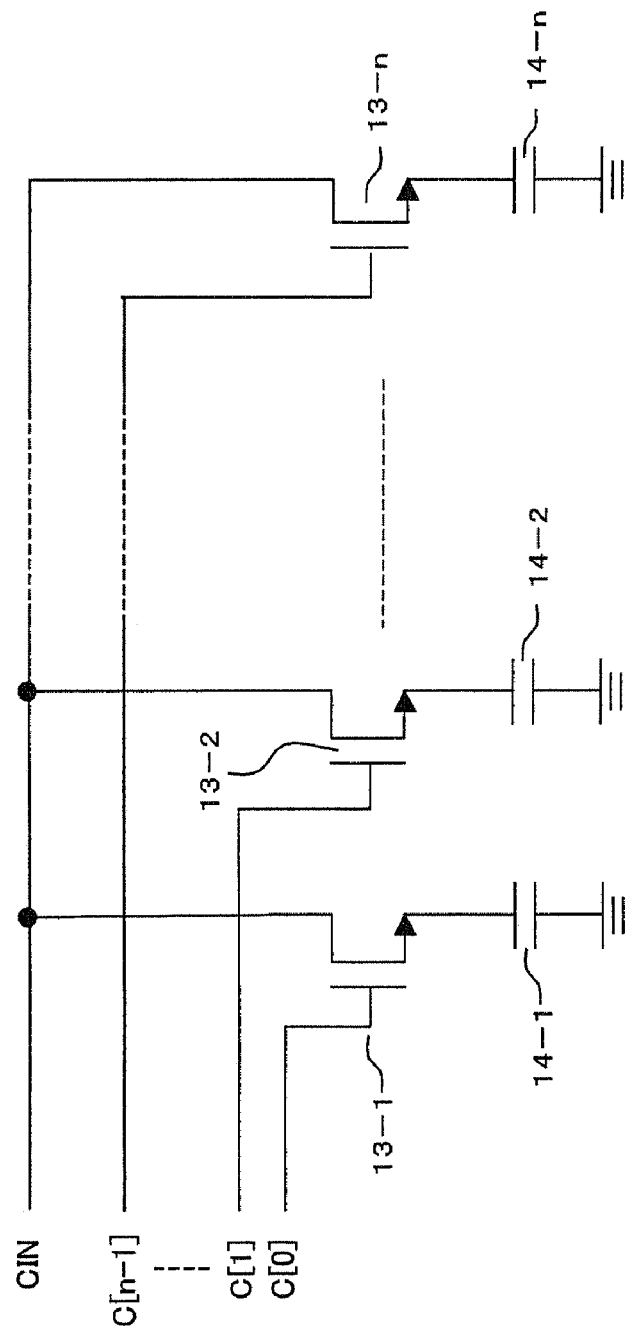
FIG. 1B shows the configuration of a conventional variable load capacitance circuit.
Figure 1C:
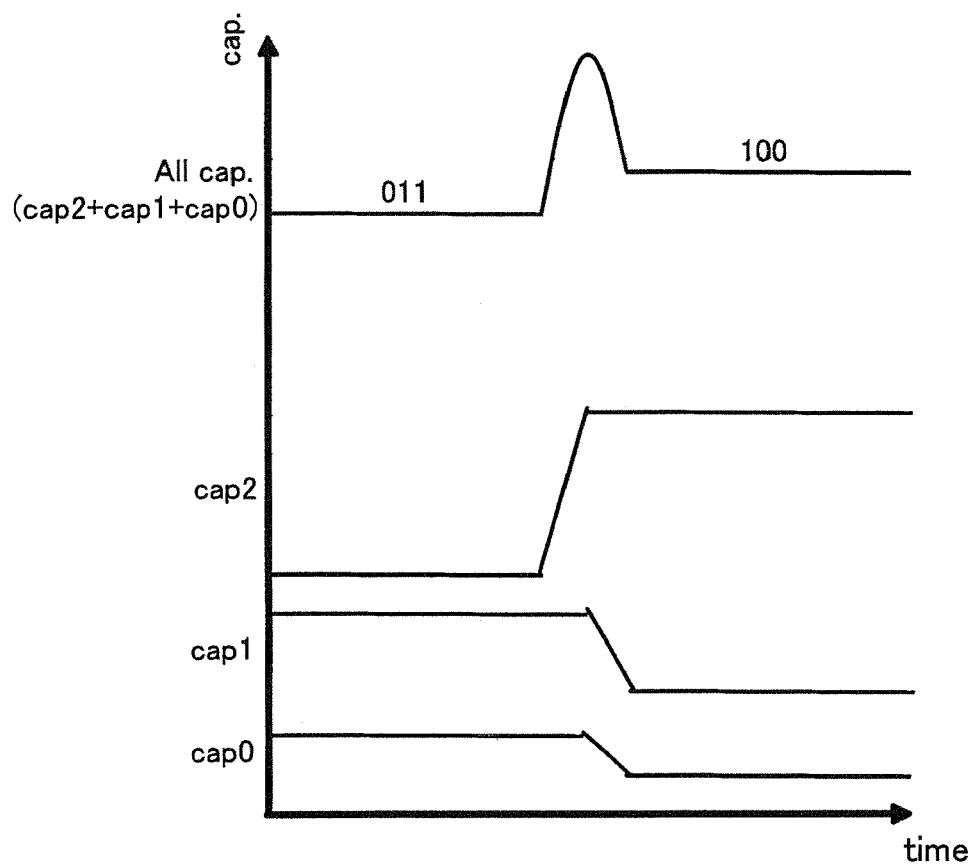
FIG. 1C shows the first capacitance change.
Figure 1D:
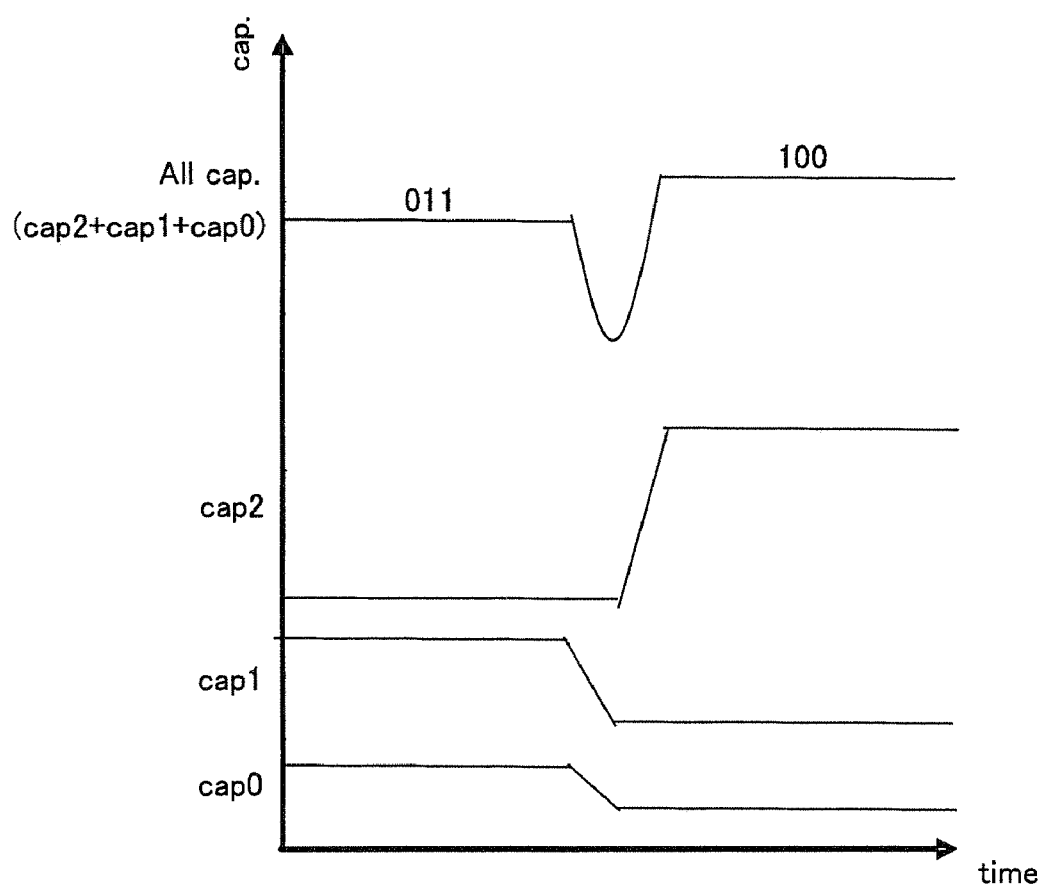
FIG. 1D shows the second capacitance change.

To a node to which the output terminal of each inverter circuit 201-h (h=1, 2, . . . , m) is connected, each variable load capacitance circuit 202-h is connected. The configuration of the variable load capacitance circuit 202-h is the same as that of the variable load capacitance circuit 12-h shown in FIG. 1B.

To each timing adjustment circuit 301-h, a signal outputted by each of the inverter circuits 201-1~201-m is inputted as m bits of a signal node[m−1:0], and n bits of externally given frequency control signal C[n−1:0] is inputted as a control signal in[n−1:0].

The timing adjustment circuit 203-h detects the edge of a clock signal generated by the ring oscillator from the signal node[m−1:0] and adjusts timing the control signal in[n−1:0] is outputted to the variable load capacitance circuits 202-h. Specifically, when the edge does not pass through a node to which the variable load capacitance circuit 202-h is connected, the control signal in[n−1:0] is outputted to the variable load capacitance circuit 202-h as a control signal out[n−1:0].

Thus, when the edge passes through the node, the load capacitance can be prevented from changing, thereby reducing the jitter of a clock signal. This clock signal is externally outputted from one node of the ring oscillator.

Figure 4:
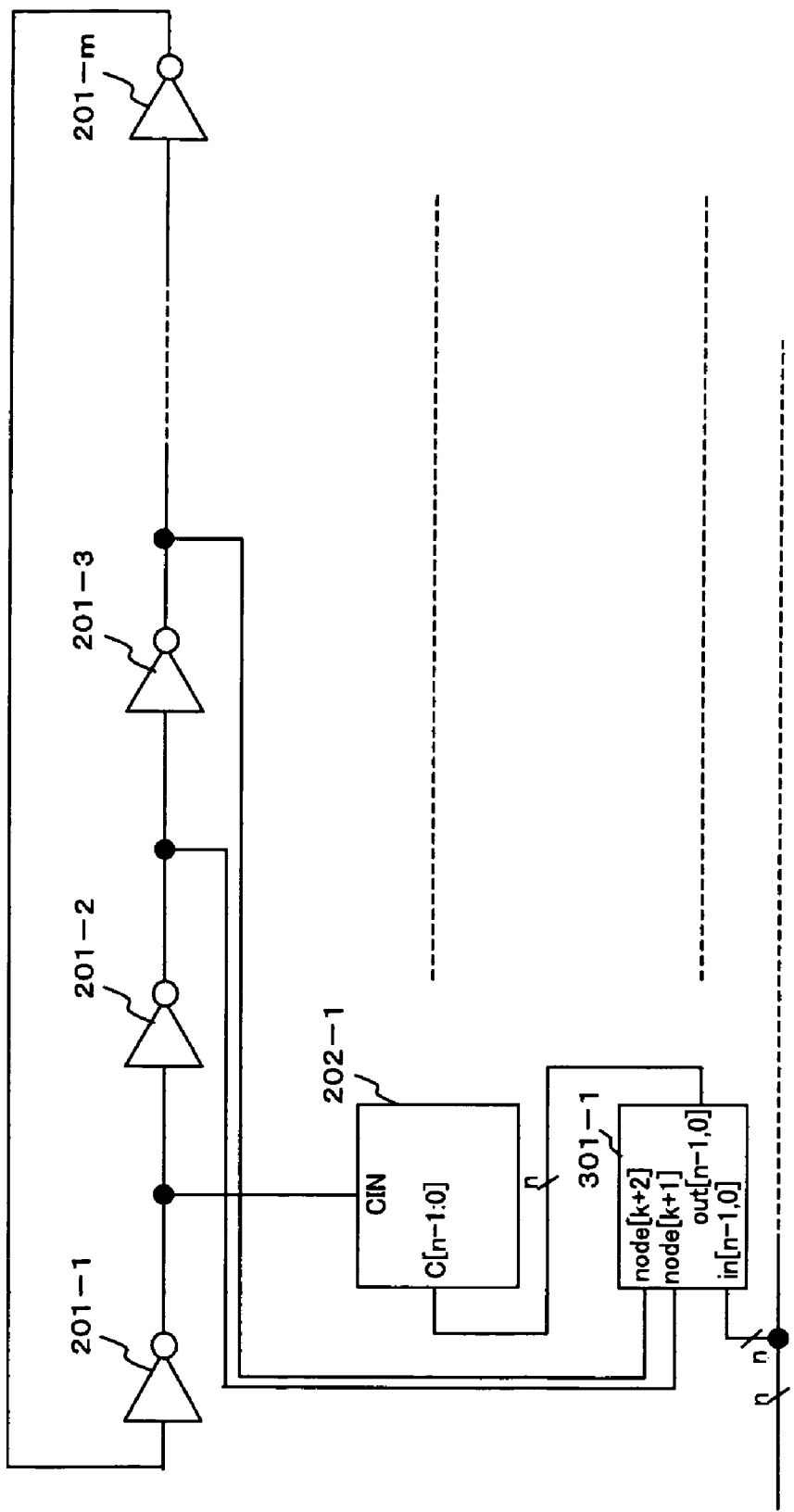
FIG. 4 shows the second configuration of the digitally controlled oscillator.

FIG. 4 shows the second configuration of the digitally controlled oscillator. This digitally controlled oscillator has a configuration obtained by replacing the timing adjustment circuits 203-1~203-m with timing adjustment circuits 301-1~301-m in the configuration shown in FIG. 3.

To each timing adjustment circuit 301-k (k=1, 2, . . . , m), signals outputted by each of two inverter circuits 201-(k+1) and 201-(k+2) are inputted as signals node[k+1] and node[k+2] and a control signal C[n−1:0] is inputted as a control signal in[n−1:0]. However, it is assumed that k indicates a node to which a variable load capacitance circuit 202-k to be controlled is connected and the (m+1)-th and (m+2)-th nodes coincide with the first and second nodes, respectively.

The timing adjustment circuit 301-k detects the edge of a clock signal from signals node[k+1] and node[k+2], and when the edge does not pass through the k-th node, a control signal in[n−1:0] is outputted to the variable load capacitance circuit 202-k as a control signal out[n−1:0].

Figure 5:
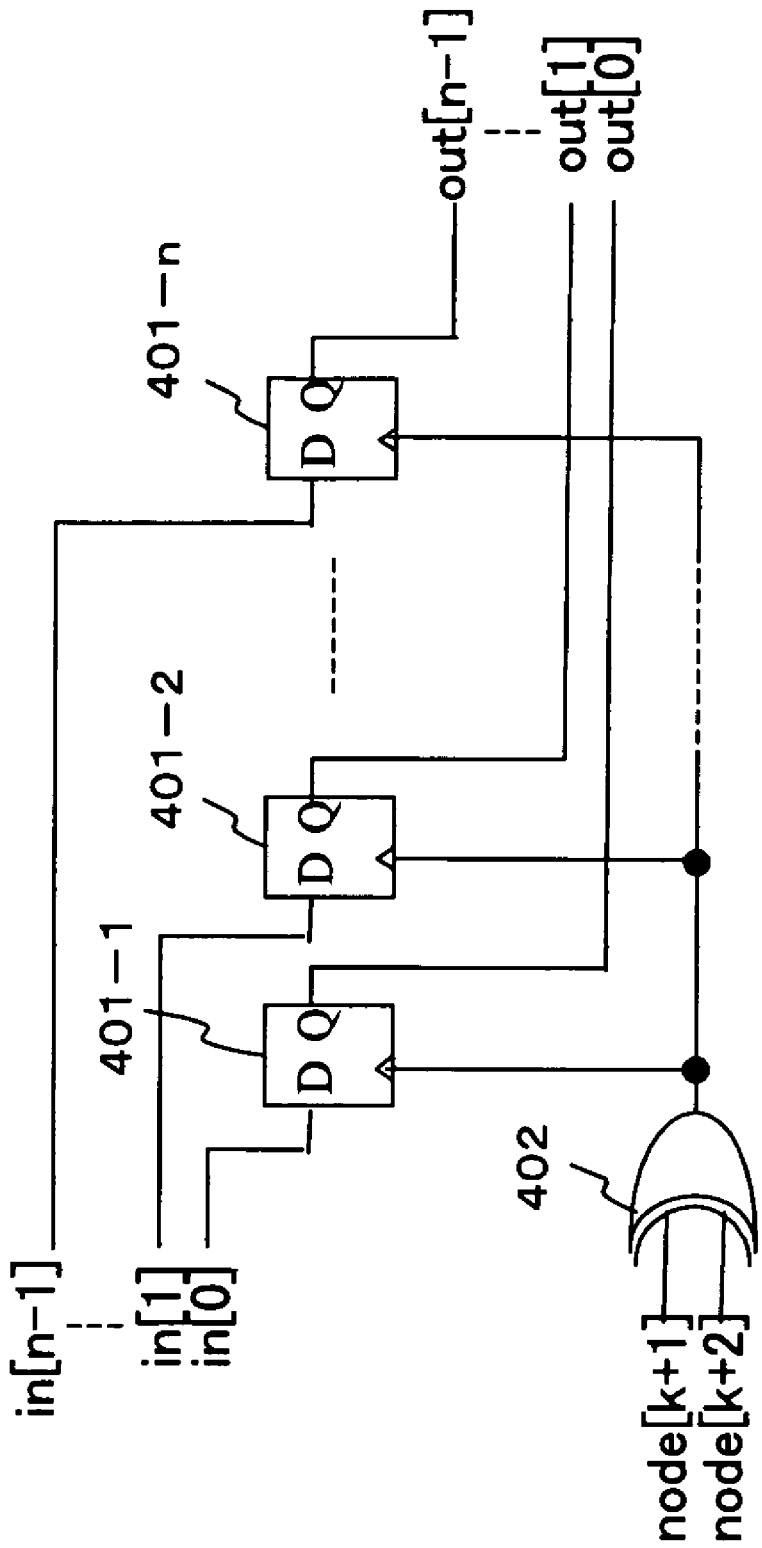
FIG. 5 shows the first configuration of the timing adjustment circuit.

FIG. 5 shows an example of the configuration of the timing adjustment circuit 301-k shown in FIG. 4. This timing adjustment circuit 301-k comprises n latch circuits 401-1~401-n and a coincidence circuit 402.

The coincidence circuit 402 outputs a signal obtained by inverting the exclusive OR (XOR) of signals node[k+1] and node[k+2] to the latch circuits 401-1~401-n. If the output signal of the coincidence circuit 402 is logic "0", each latch circuit 401-g (g=1,2, . . . , n) latches the value of control signal in[g−1]. If the output signal of the coincidence circuit 402 is logic "1", each latch circuit 401-g (g=1,2, . . . , n) outputs the latched value as control signal out[g−1].

Figure 6:
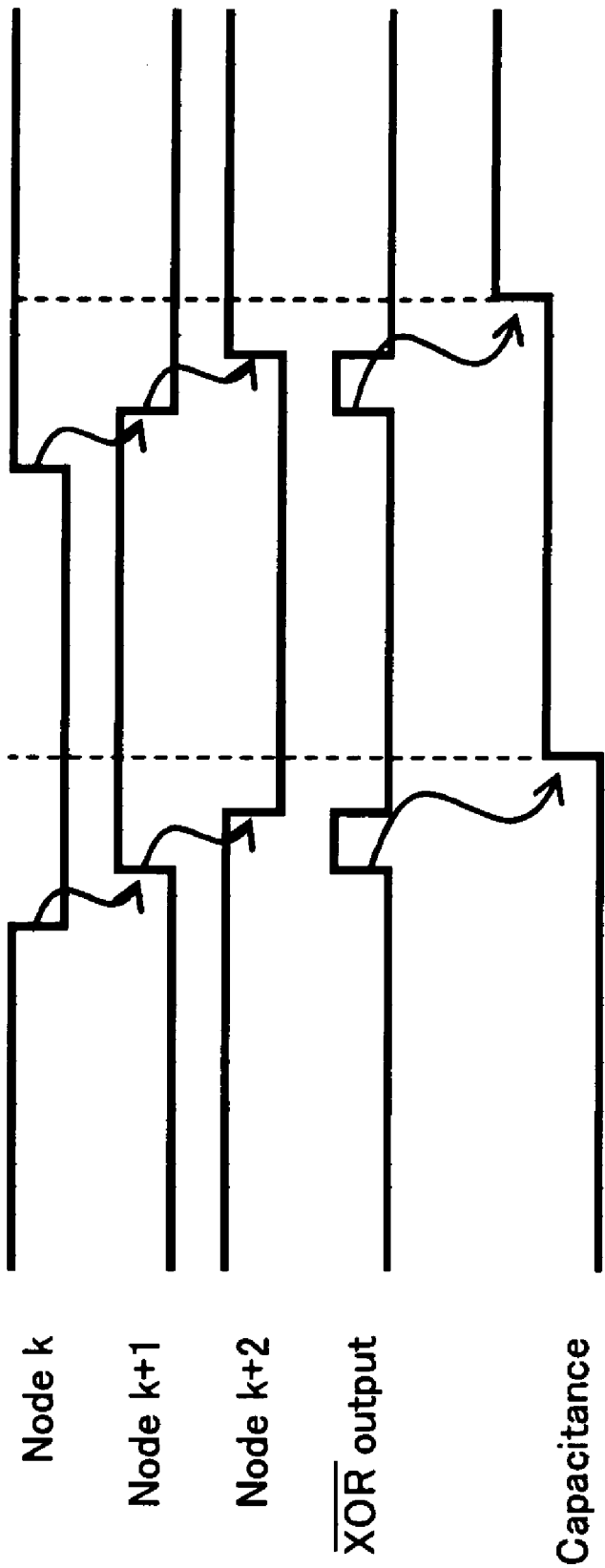
FIG. 6 is the first timing chart of the timing adjustment.

At this moment, the capacitance of the variable load capacitance circuit 202-k connected to the k-th node of the ring oscillator changes as shown in FIG. 6. In the timing chart shown in FIG. 6, the horizontal axis indicates the lapse of time, and Node k, Node k+1 and Node k+2 indicate the clock signals of the k-th, (k+1)th and (k+2)th nodes, respectively, of the ring oscillator. $\overline{XOR}$ output indicates the output signal of the coincidence circuit 402, and Capacitance indicates the capacitance of the variable load capacitance circuit 202-k. Curved arrows indicate that the change of each signal incurs the change of another signal or capacitance.

As shown in FIG. 6, the clock signal of the (k+1)th node can be obtained by inverting the clock signal of the k-th node, and the clock signal of the (k+2)th node can be obtained by inverting the clock signal of the (k+1)th node. There is a time difference corresponding to the delay time of the inverter circuit 201 between the clock signals of two adjacent nodes. Therefore, the edge of a clock signal passes through each node at the time intervals in order of the k-th, (k+1)th and (k+2)th nodes.

Since until the edge passes through the (k+2)th node after passes the (k+1)th node, the respective clock signals of those adjacent nodes have the same value, the output signal of the coincidence circuit 402 becomes logic "1". As a result, control signal out[n−1:0] is modified to change the load capacitance of the variable load capacitance circuit 202-k. Since this timing is immediately after the edge passes through the k-th node, there will be a very little possibility that jitter may occur in the edge of a clock signal.

Then, after the edge passes through the (k+2)th node, the clock signal of the (k+2)th node inverts. Therefore, the output signal of the coincidence circuit 402 becomes logic "0". As a result, control signal in[n−1:0] is latched. Therefore, before the edge passes through the (k+1)th node, control signal out[n−1:0] does not change even if control signal in[n−1:0] is modified.

In this way, in each node, load capacitance can be prohibited to change when the edge passes through the node.

Figure 7:
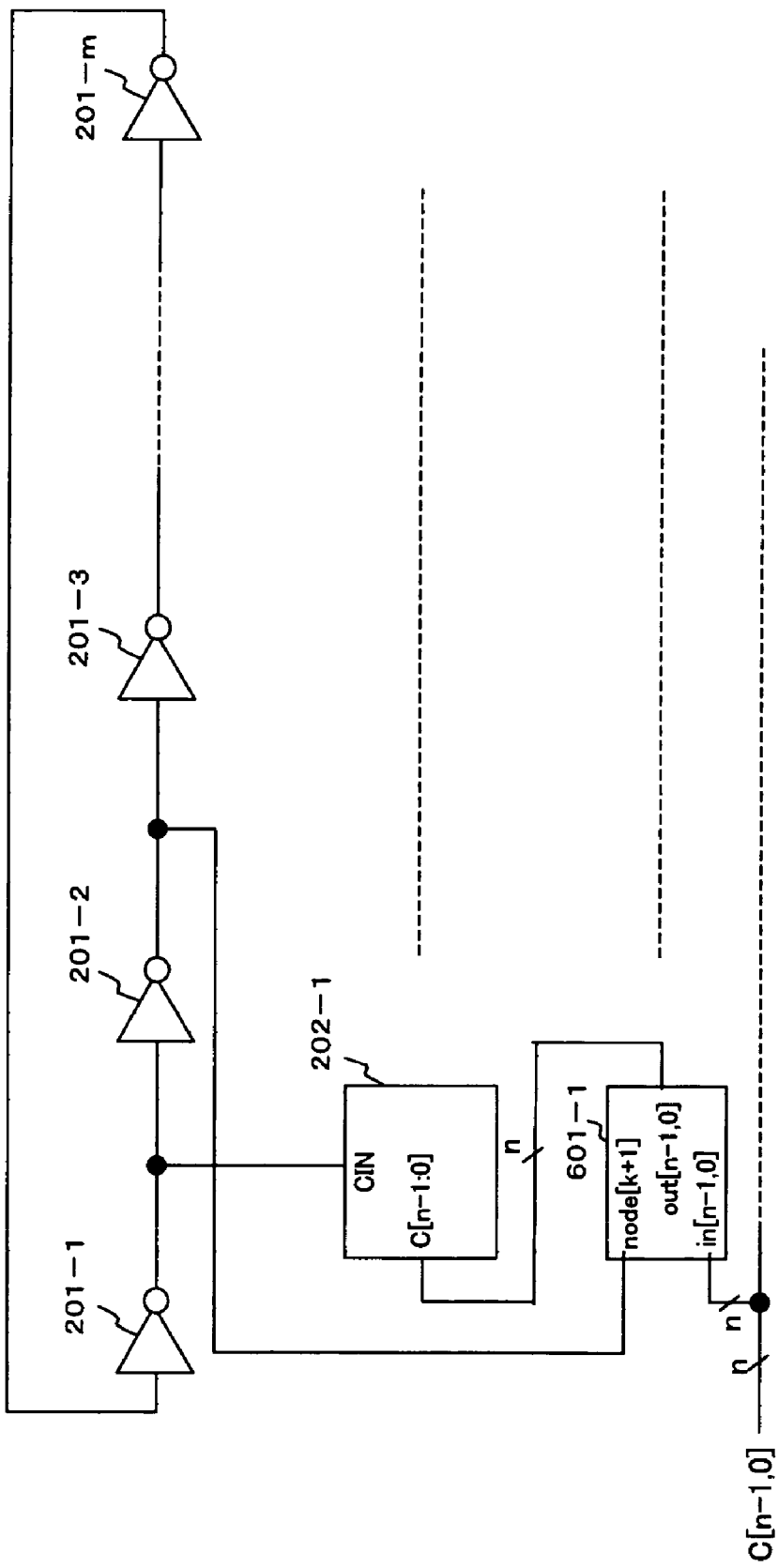
FIG. 7 shows the third configuration of the digitally controlled oscillator.

FIG. 7 shows the third configuration of the digitally controlled oscillator. This digitally controlled oscillator has a configuration obtained by replacing the timing adjustment circuits 203-1~203-m with timing adjustment circuits 601-1~601-m in the configuration shown in FIG. 3.

To each timing adjustment circuit 601-k (k=1, 2, ..., m), a signal outputted by the inverter circuit 201-(k+1) is inputted as signal node[k+1], and control signal C[n−1:0] is inputted as control signal in[n−1:0].

The timing adjustment circuit 601-k detects the edge of a clock signal from the signal node[k+1], and when the edge does not pass through the k-th node, it outputs control signal in[n−1:0] to the variable load capacitance circuit 202-k as control signal out[n−1:0].

Figure 8:
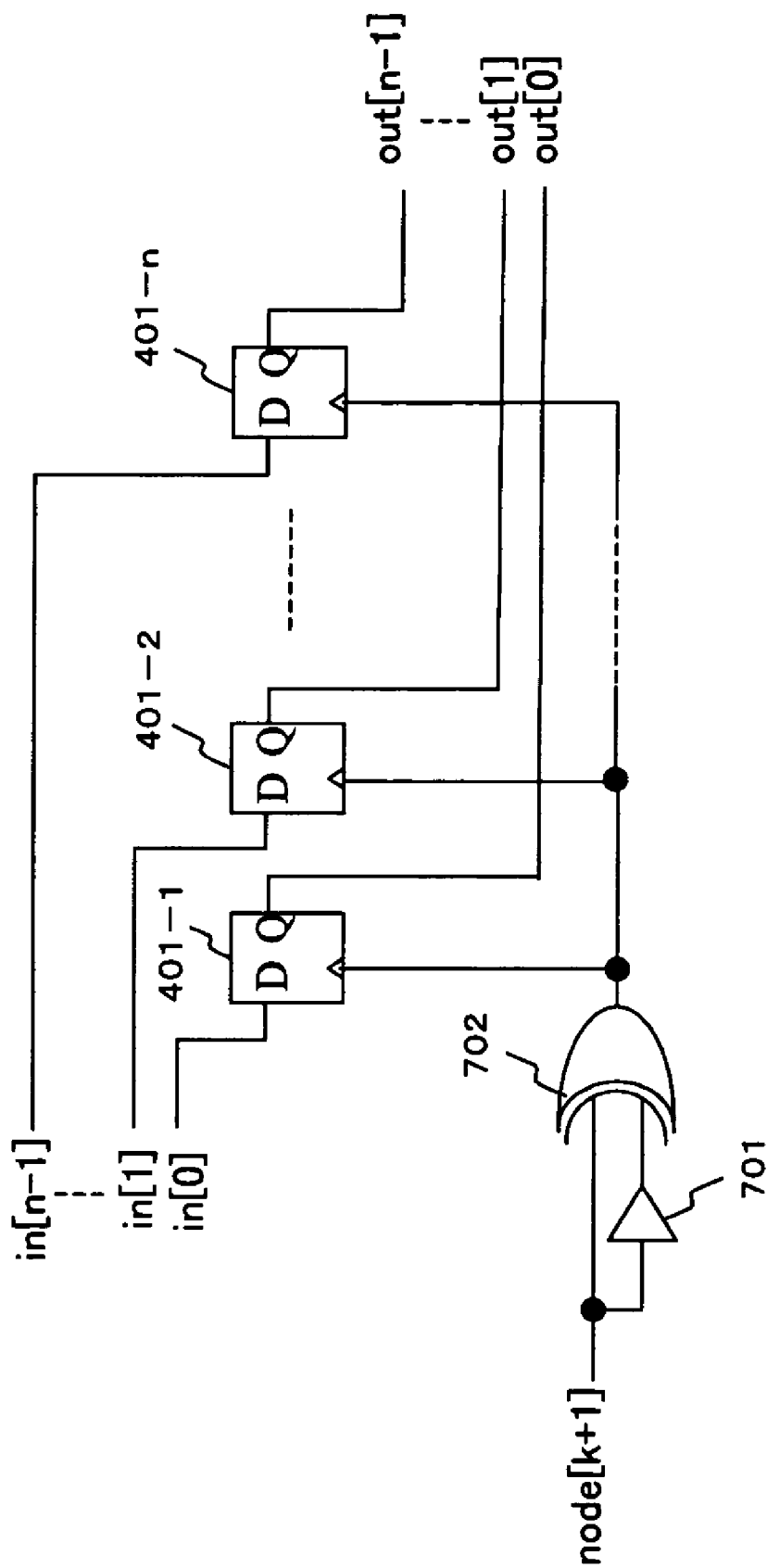
FIG. 8 shows the second configuration of the timing adjustment circuit.

FIG. 8 shows an example of the configuration of the timing adjustment circuit 601-k shown in FIG. 7. This timing adjustment circuit 601-k has a configuration obtained by replacing the coincidence circuit 402 with a buffer circuit 701 and a XOR circuit 702 in the configuration shown in FIG. 5.

The buffer circuit 701 is a delay element with the same delay time as that of the inverter circuit 201-(k+2), and delays and outputs signal node[k+1] to the XOR circuit 702. The XOR circuit 702 outputs the XOR of the signal node[k+1] and the output signal of the buffer circuit 701 to the latch circuits 401-1~401-n.

According to such a timing adjustment circuit 601-k, in each node, load capacitance can be prohibited to change when the edge passes through a node, as in the timing adjustment circuit 301-k shown in FIG. 5.

Instead of the combination of the buffer circuit 701 and the XOR circuit 702, a combination of an inverter circuit and a coincidence circuit can also be used. In this case, the inverter circuit has the same delay time as the inverter circuit 201-(k+2).

Figure 9:
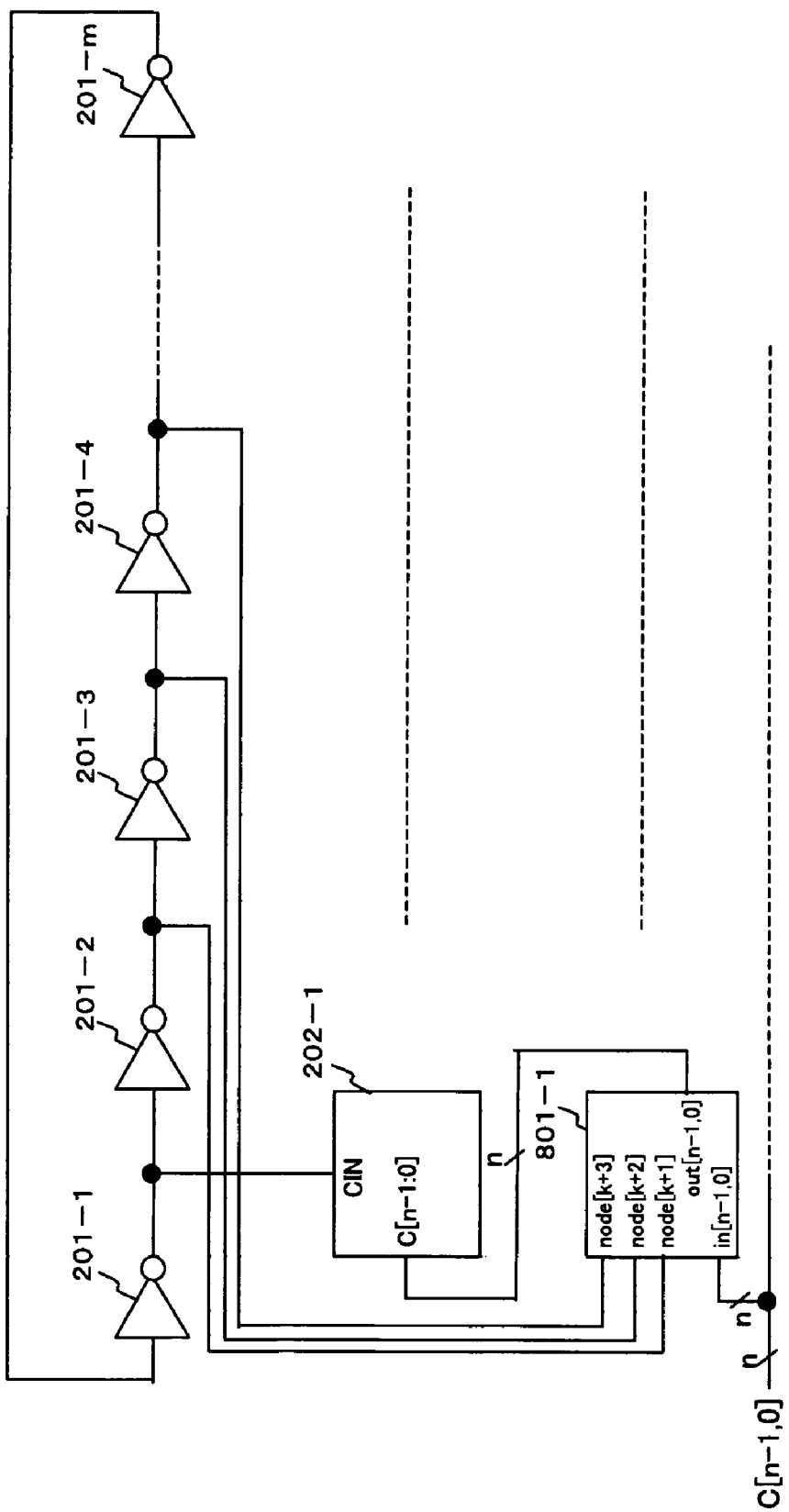
FIG. 9 shows the fourth configuration of the digitally controlled oscillator.

FIG. 9 shows the fourth configuration of the digitally controlled oscillator. This digitally controlled oscillator has a configuration obtained by replacing the timing adjustment circuits 203-1~203-m with timing adjustment circuits 801-1~801-m in the configuration shown in FIG. 3.

To each timing adjustment circuit 801-k (k=1, 2, ..., m), signals outputted by three inverter circuits 201-(k+1), 201-(k+2) and 201-(k+3) are inputted as signals node[k+1], node[k+2] and node[k+3], respectively, and control signal C[n−1:0] is inputted as control signal in[n−1:0].

The timing adjustment circuit 801-k detects the edge of a clock signal from the signals node[k+1], node[k+2] and node[k+3], and when the edge does not pass through the k-th node, it outputs control signal in[n−1:0] to the variable load capacitance circuit 202-k as control signal out[n−1:0].

Figure 10:
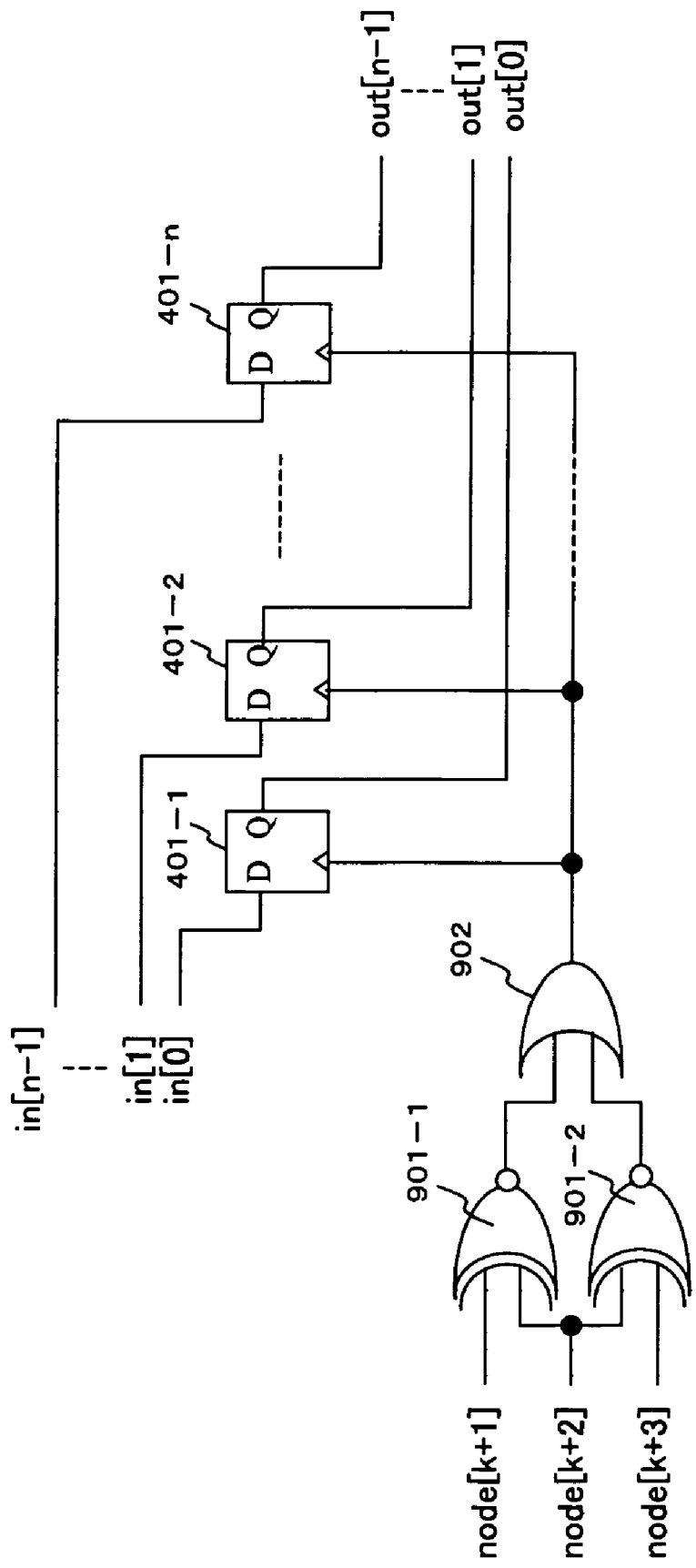
FIG. 10 shows the third configuration of the timing adjustment circuit.

FIG. 10 shows an example of the configuration of the timing adjustment circuit 801-k shown in FIG. 9. This timing adjustment circuit 801-k has a configuration obtained by replacing the coincidence circuit 402 with coincidence circuits 901-1 and 901-2 and a OR circuit 902 in the configuration shown in FIG. 5.

The coincidence circuit 901-1 outputs a signal obtained by inverting the XOR of signals node[k+1] and node[k+2] to the OR circuit 902, and the coincidence circuit 901-2 outputs a signal obtained by inverting the XOR of signals node[k+2] and node[k+3] to the OR circuit 902. The OR circuit 902 outputs the logical sum of the output signals of the coincidence circuits 901-1 and 901-2 to the latch circuits 401-1~401-n.

Therefore, if the signals node[k+1] and node[k+2] are the same value or the signals node[k+2] and node[k+3] are the same value, the OR circuit 902 outputs logic "1" and the control signal out[n−1:0] is modified.

According to such a timing adjustment circuit 801-k, as in the timing adjustment circuit 301-k shown in FIG. 5, in each node, load capacitance can be prohibited to change when the edge passes through a node, and also the edge can be more surely detected.

Although in the above-described preferred embodiments, a timing adjustment circuit adjusts the timing of all bits of control signal C[n−1:0], only a part of the bits can also be targeted for timing adjustment.

Figure 11A:
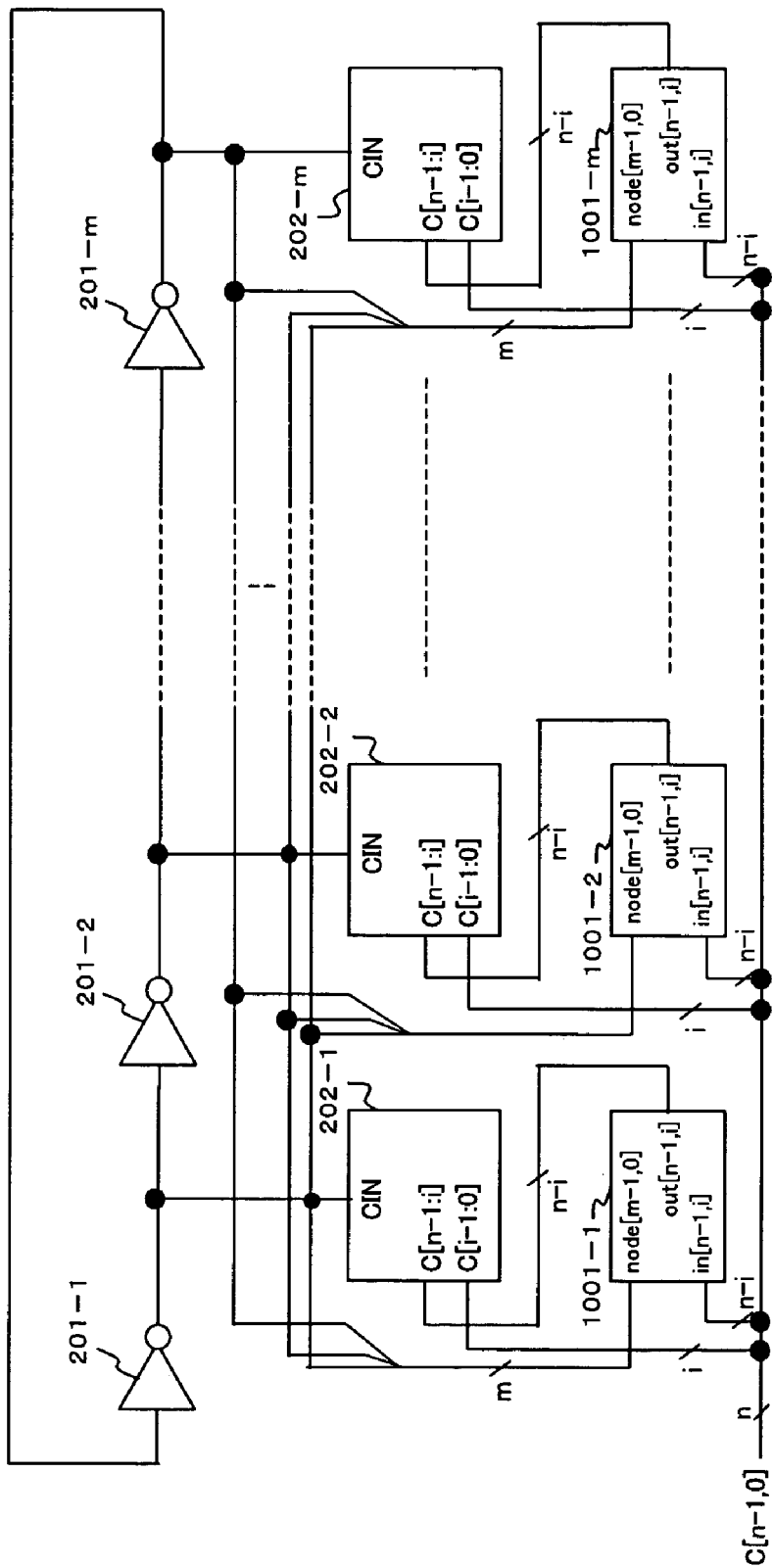
FIG. 11A shows the fifth configuration of the digitally controlled oscillator.

FIG. 11A shows an example of the fifth configuration of such a digitally controlled oscillator. This digitally controlled oscillator has a configuration obtained by replacing the timing adjustment circuits 203-1~203-m with timing adjustment circuits 1001-1~1001-m in the configuration shown in FIG. 3.

To each timing adjustment circuit 1001-h (h=1, 2, ..., m), signals outputted by each of the inverter circuits 201-1~201-m are inputted as m bits of signal node[m−1:0], and (n−i) bits of C[n−1:i] of n bits of control signal C[n−1:0] is inputted as control signal in[n−1:i].

The timing adjustment circuit 1001-h detects the edge of a clock signal generated by the ring oscillator from the signal node[m−1:0], and when the edge does not pass through the h-th node, control signal in[n−1:i] to the variable load capacitance circuit 202-h as control signal out[n−1:i].

However, i bits of C[i−1:0] of the control signal C[n−1:0] are directly inputted to the variable load capacitance circuit 202-h without passing through the timing adjustment circuit 1001-h. For example, if the capacitance of capacitors controlled by control signal C[i−1:0] is large and the capacitance of capacitors controlled by control signal C[n−1:i] is small, the rough adjustment and fine adjustment of a frequency can be separately made, using control signals C[i−1:0] and C[n−1:i].

Since usually one time of the rough frequency adjustment is sufficient, by fixing the value of the control signal C[i−1:0] after that, frequency can be controlled by using only the control signal C[n−1:i] outputted by the timing adjustment circuit 1001-h.

In this way, by separately using control signal C[n−1:0] for the rough adjustment and fine adjustment of a frequency, the number of signal terminals targeted for timing adjustment can be restricted, thereby reducing the circuit scale of the timing adjustment circuit 1001-h.

FIG. 11B shows an example of the sixth configuration of another digitally controlled oscillator for separately performing the rough adjustment and fine adjustment of a frequency. This digitally controlled oscillator comprises a ring oscillator composed of m inverter circuits 201-1~201-m, m variable load capacitance circuits 1101-1~1101-m, m timing adjustment circuits 1102-1~1102-m, NMOS transistors 1103-1~1103-m, 1105-1~1105-i, 1106 and 1107-1~1107-i and a resistor 1104.

To a node to which the output terminal of each inverter circuit 201-h (h=1, 2, ..., m) is connected, each variable load capacitance circuit 1101-h is connected. The variable load capacitance circuit 1101-h has a configuration obtained by replacing the n transistors 13-1~13-n with (n−i) transistors 13-1~13-(n−i), then capacitors 14-1~14-n with (n−i) capacitors 14-1~14-(n−i) and n bits of the control signal C[n−1:0] with (n−i) bits of control signal C[n−1:i] in the variable load capacitance circuit 12-h shown in FIG. 1B.

To each timing adjustment circuit 1102-h, signals outputted by each of the inverter circuits 201-1~201-m are inputted as m bits of signal node[m−1:0], and (n−i) bits of control signal C[n−1:i] are inputted as control signal in[n−1:i]. The operation of the timing adjustment circuit 1102-h is the same as that of the timing adjustment circuit 1001-h shown in FIG. 11A.

However, the remaining i bits of the control signal C[i−1:0] is used for the on/off control of the transistors 1105-1~1105-i. By changing the number of parallel-connected transistors, using this control signal C[i−1:0], a reference current value flowing in the resistor 1104 changes. A current value flowing in the transistor 1103-h connected to each inverter circuit 201-h changes in proportion to this reference current value. Thus, the frequency of the ring oscillator can be changed.

Thus, the rough adjustment and fine adjustment of a frequency can be separately performed using control signals C[i−1:0] and C[n−1:i].

In this way, by providing a function to control the ring oscillator by current separately from the variable load capacitance circuit 1101-h, the number of signal terminals targeted for timing adjustment can be restricted, thereby reducing the circuit scale of the timing adjustment circuit 1102-h.

Next, the variations of the above-described preferred embodiments are described with reference to FIGS. 12-17.

FIG. 12 shows another configuration of the timing adjustment circuit 301-k shown in FIG. 4. This timing adjustment circuit has a configuration obtained by adding buffer circuits 403-1~403-p and selector circuits 404-1~404-n to the configuration shown in FIG. 5.

The output of each latch circuit 401-g (g=1, 2, . . . , n) is connected to each selector circuit 404-g via three routes of the buffer circuit 403, the numbers of whose respective stages are 0, 1 and 2. The selector circuit 404-g selects one of the routes according to a control signal inputted from a timing adjustment pin and outputs a control signal inputted from the selected route as control signal out[g−1]. Thus, timing of outputting control signal out[n−1:0] to the variable load capacitance circuit 202-k can be adjusted by the control of an external terminal.

Figure 13:
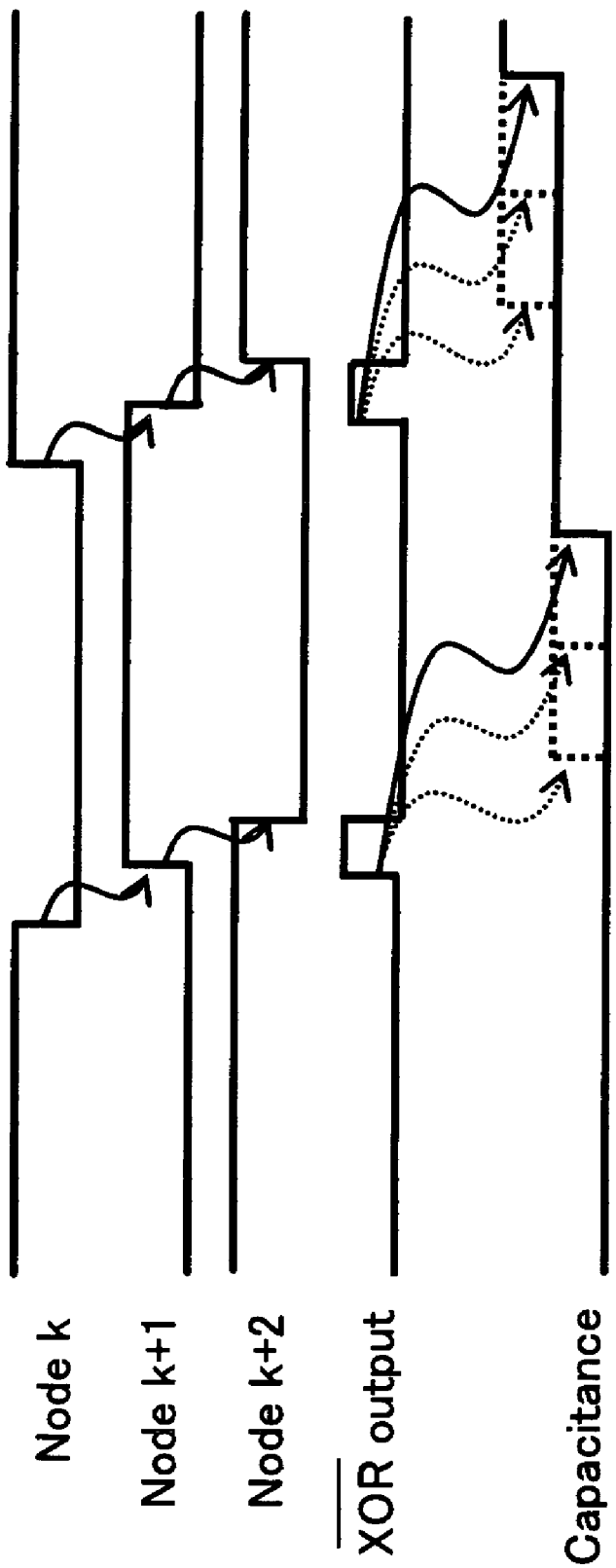
FIG. 13 is the second timing chart of the timing adjustment.
Figure 15:
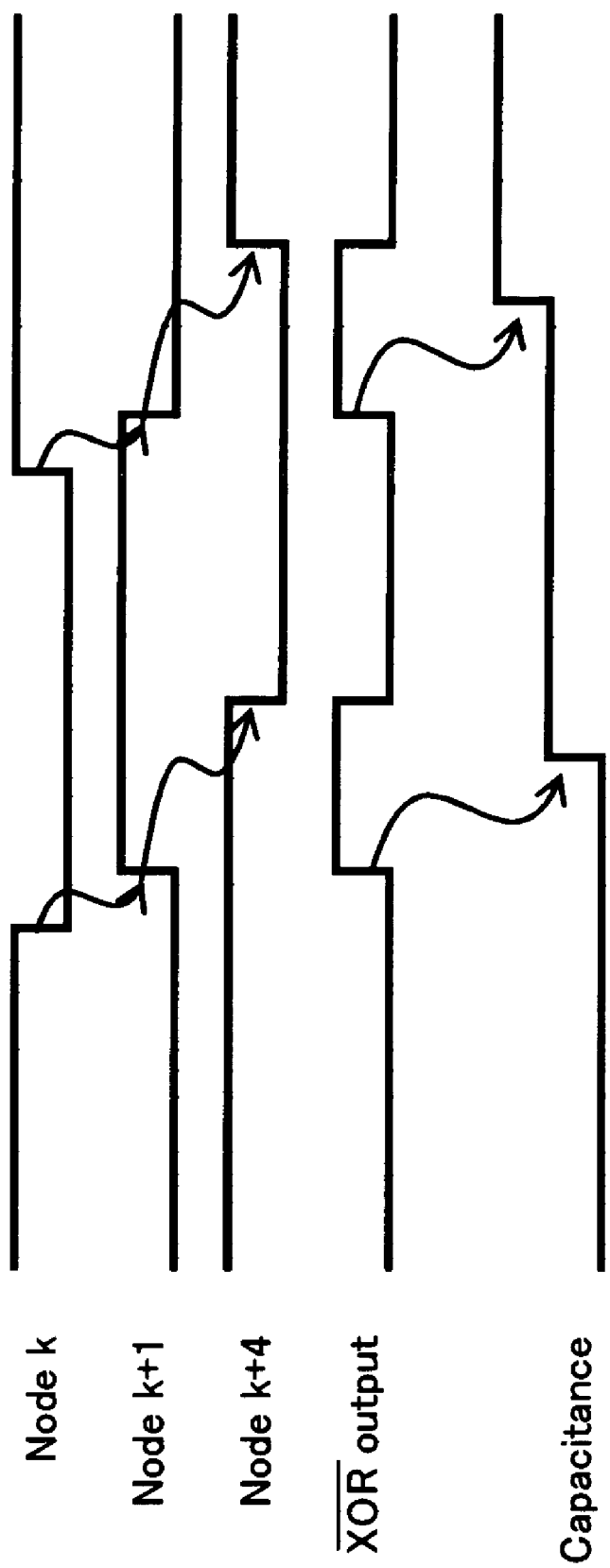
FIG. 15 is the third timing chart of the timing adjustment.

The timing chart shown in FIG. 13 shows the capacitance change of the variable load capacitance circuit 202-k in the case where the timing adjustment circuit shown in FIG. 12 is used. As shown in FIG. 13, timing the output signal of the coincidence circuit 402 is conveyed to the variable load capacitance circuit 202-k is switched by the route switching by the external terminal, thereby adjusting the timing of capacitance change. Thus, the process unevenness can be corrected or timing adjustment can be optimized.

FIG. 14 shows an example of the configuration of the timing adjustment circuit 203-h shown in FIG. 3. This timing adjustment circuit has a configuration obtained by adding selector circuits 1401-1 and 1401-2 to the configuration shown in FIG. 5.

m bits of signal node [m−1:0] are inputted to each of the two selectors 1401-1 and 1401-2 in parallel. Each selector circuit 1404 selects one of the bits, according to a control signal inputted from a selector pin and outputs it to the coincidence circuit 402. Thus, two nodes that the coincidence circuit 402 uses to detect the edge can be selected by the control of an external terminal.

For example, if the (k+1)th and (k+2)th nodes are selected, the timing chart of each signal becomes as shown in FIG. 6. If the (k+1)th and (k+4)th nodes are selected, the timing chart is as shown FIG. 15. In the timing chart shown in FIG. 15, since a period in which the output signal of the coincidence circuit 402 becomes logic "1" becomes long compared with the case shown in FIG. 6, a period in which capacitance switching is allowed can be lengthened. Thus, the process unevenness can be corrected or timing adjustment can be optimized.

If two nodes between which there is one node, such as the (k+1)th and (k+3)th nodes, are selected, an XOR circuit is used instead of the coincidence circuit 402. In that case, its timing chart becomes as shown in FIG. 16.

Figure 16:
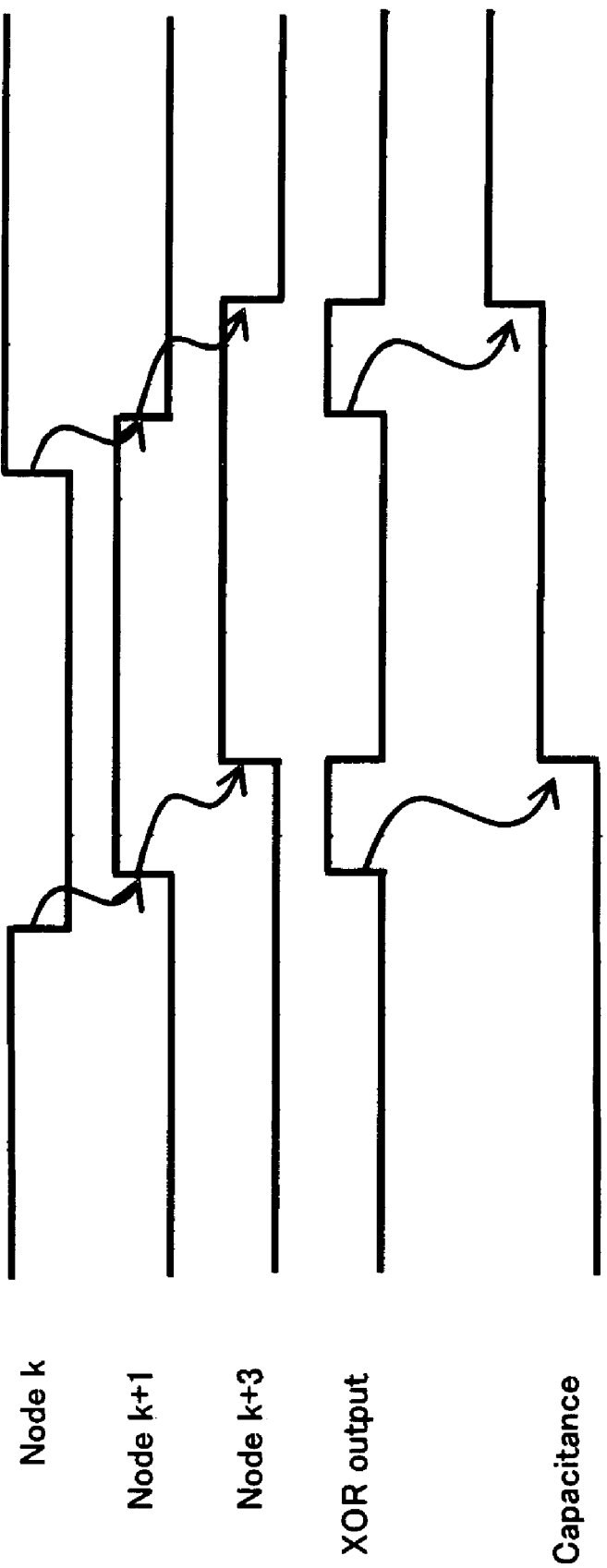
FIG. 16 is the fourth timing chart of the timing adjustment.

As shown in FIG. 16, the clock signal of the (k+3)th node can be obtained by inverting the clock signal of the (k+1)th node twice, and there is a specific time difference between the clock signals of two nodes. Therefore, until the edge of a clock signal passes through the (k+3)th node after it passes through the (k+1)th node, the output signal of the XOR circuit becomes logic "1" since the clock signals of the nodes take different values. As a result, the control signal out[n−1:0] is modified to change the load capacitance of the variable load capacitance circuit 202-k. In this case, a period in which capacitance switching is allowed is lengthened compared with the case shown in FIG. 6.

Then, when the edge passes through the (k+3)th node, the clock signal of the (k+3)th node inverts. Therefore, the output signal of the XOR circuit becomes logic "0". As a result, the control signal in[n−1:0] is latched. Therefore, before the edge passes through the (k+1)th node next time, the control signal out[n−1:0] does not change.

In this way, in each node, load capacitance can be prohibited to change when the edge passes through the node.

Figure 17:
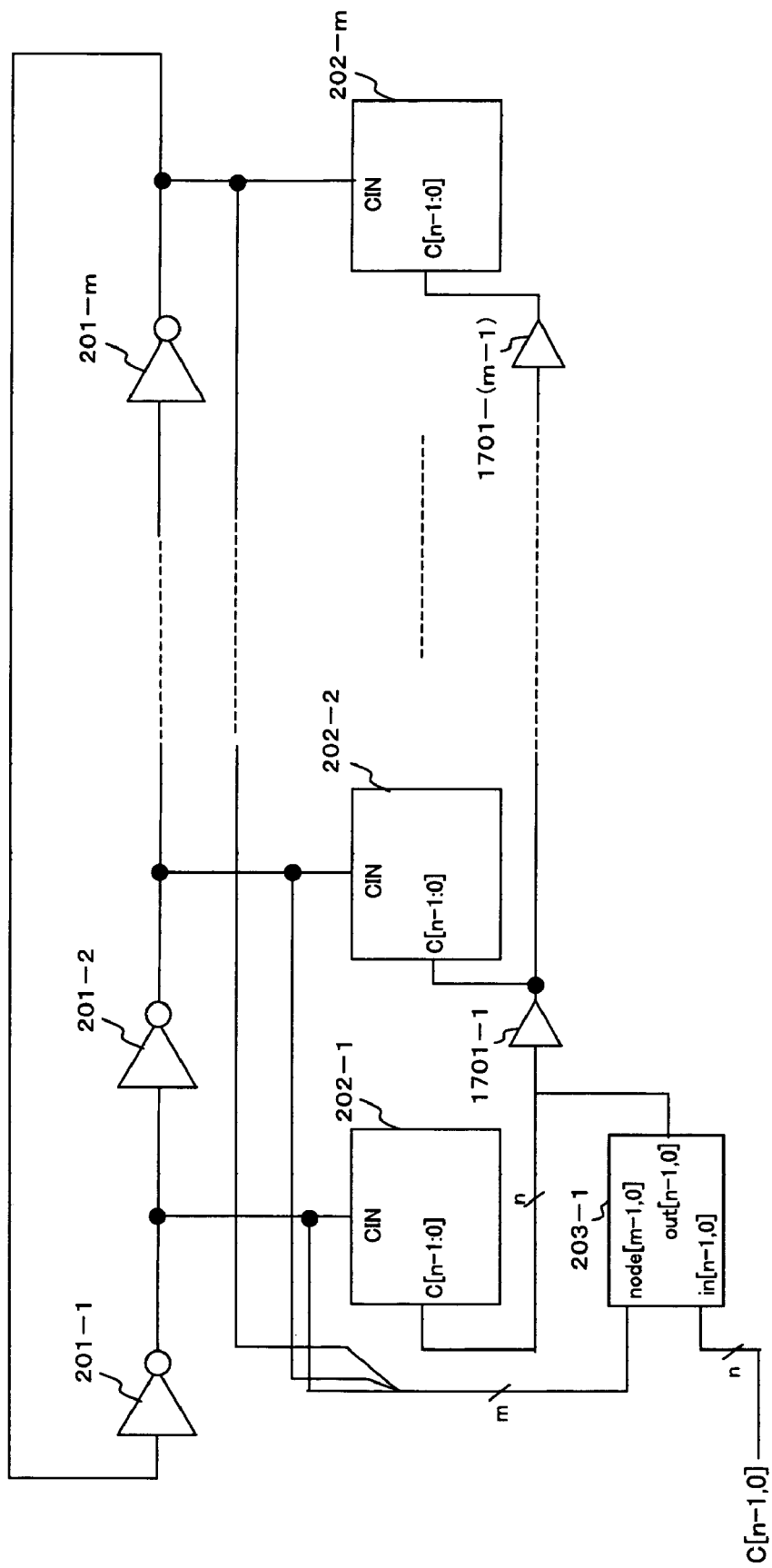
FIG. 17 shows the seventh configuration of the digitally controlled oscillator.

FIG. 17 shows the seventh configuration of the digitally controlled oscillator. This digitally controlled oscillator has a configuration obtained by removing the timing adjustment circuits 203-2~203-m and adding buffer circuits 1701-1~1701-(m−1) from/to the configuration shown in FIG. 3.

Each buffer circuit 1701-h (h=1, 2, . . . , m−1) has the same delay time as the inverter circuit 201-(h+1), and a control signal outputted from the timing adjustment circuit 203-1 reaches the variable load capacitance circuit 202-(h+1) via h stages of the buffer circuits 1701.

In this way, by providing only one of the variable load capacitance circuits 202-1~202-m with the timing adjustment circuit 203 and connecting the input of the remaining variable load capacitance circuits 202 to the output of the timing adjustment circuit 203 via delay stages, the increase of the circuit scale due to a plurality of timing adjustment circuits 203 can be suppressed.

What is claimed is:

1. A digitally controlled oscillator, comprising:
a ring oscillator composed of a plurality of delay circuits connected in a ring;
a plurality of variable load capacitance circuits each connected to each node between adjacent delay circuits of the ring oscillator, for changing load capacitance according to an external control signal; and
a control circuit for adjusting timing of the control signal that is inputted to the plurality of variable load capacitance circuits, by using a clock signal of one or more nodes of the ring oscillator, wherein the control circuit comprises a plurality of timing adjustment circuits each connected to each of the plurality of variable load capacitance circuits, for adjusting timing of the control signal that is inputted to each variable load capacitance circuit, by using the clock signal of the one or more nodes of the ring oscillator; and a delay circuit for delaying control signals outputted from the plurality of timing adjustment circuits by time selected by an externally inputted signal.

2. The digitally controlled oscillator according to claim 1, wherein
each of the plurality of timing adjustment circuits comprises a latch circuit for latching the control signal and a coincidence circuit for generating a signal obtained by inverting an exclusive logical sum of clock signals of two nodes and outputting the generated signal to the latch circuit.

3. The digitally controlled oscillator according to claim 2, wherein
each of the plurality of timing adjustment circuits further comprises a selection circuit for selecting the clock signals of the two nodes from among clock signals of a plurality of nodes of the ring oscillator and outputting the clock signals of the two nodes to the coincidence circuit.

4. The digitally controlled oscillator according to claim 1, wherein
each of the plurality of timing adjustment circuits comprises a latch circuit for latching the control signal and an exclusive logical sum circuit for generating an exclusive logical sum of clock signals of two nodes and outputting the exclusive logical sum to the latch circuit.

5. The digitally controlled oscillator according to claim 4, wherein
each of the plurality of timing adjustment circuits further comprises a selection circuit for selecting the clock signals of the two nodes from among clock signals of a plurality of nodes of the ring oscillator and outputting the clock signals of the two nodes to the exclusive logical sum circuit.

6. The digitally controlled oscillator according to claim 1, wherein
each of the plurality of timing adjustment circuits comprises a latch circuit for latching the control signal and an exclusive logical sum circuit for generating an exclusive logical sum of a clock signal of one node and a signal obtained by delaying the clock signal of the one node and outputting the exclusive logical sum to the latch circuit.

7. The digitally controlled oscillator according to claim 1, wherein
each of the plurality of timing adjustment circuits comprises a latch circuit for latching the control signal and a coincidence circuit for generating an exclusive logical sum of a clock signal of one node and a signal obtained by inverting the clock signal of the one node and outputting a signal obtained by inverting the exclusive logical sum to the latch circuit.

8. The digitally controlled oscillator according to claim 1, wherein
each of the plurality of variable load capacitance circuits changes load capacitance slightly according to the control signal from the control circuit and largely according to another control signal.

9. The digitally controlled oscillator according to claim 1, further comprising
a variable current circuit for changing current of the plurality of delay circuits of the ring oscillator, according to an external control signal.

10. The digitally controlled oscillator according to claim 1, wherein
the control circuit comprises a timing adjustment circuit connected to one of the plurality of variable load capacitance circuits, for adjusting timing of the control signal that is inputted to the one of the plurality of variable load capacitance circuits, by using a clock signal of the one or more node, and a delay circuit for delaying the control signal outputted from the timing adjustment circuit and distributing the control signal to each of the remaining variable load capacitance circuits.

11. A digitally controlled oscillator, comprising:
ring oscillator means composed of a plurality of delay means connected in a ring;
a plurality of variable load capacitance means each connected to each node between adjacent delay means of the ring oscillator means, for changing load capacitance according to an external control signal; and
a control means for adjusting timing of the control signal that is inputted to the plurality of variable load capacitance means, by using a clock signal of one or more nodes of the ring oscillator means, wherein the control means comprises a plurality of timing adjustment means each connected to each of the plurality of variable load capacitance means, for adjusting timing of the control signal that is inputted to each variable load capacitance means, by using the clock signal of the one or more nodes of the ring oscillator means; and
a delay means for delaying control signals outputted from the plurality of timing adjustment means by time selected by an externally inputted signal.

12. The digitally controlled oscillator according to claim 1, wherein the control circuit detects an edge of the clock signal from the clock signal of the one or more nodes, and when any of the edge does not pass through a node to which a variable load capacitance circuit to be controlled is connected, the control circuit outputs the control signal to the variable load capacitance circuit to be controlled.

* * * * *